United States Patent
Hong et al.

(10) Patent No.: US 8,361,224 B2
(45) Date of Patent: Jan. 29, 2013

(54) COLLOIDAL PHOTONIC CRYSTALS USING COLLOIDAL NANOPARTICLES AND METHOD FOR PREPARATION THEREOF

(75) Inventors: Young-jun Hong, Daejeon (KR); Sang-hyuk Im, Daejeon (KR)

(73) Assignee: LG Chem, Ltd., Seoul (KR)

(*) Notice: Subject to any disclaimer, the term of this patent is extended or adjusted under 35 U.S.C. 154(b) by 302 days.

(21) Appl. No.: 12/819,869

(22) Filed: Jun. 21, 2010

(65) Prior Publication Data

US 2010/0255192 A1 Oct. 7, 2010

Related U.S. Application Data

(62) Division of application No. 11/593,052, filed on Nov. 6, 2006, now Pat. No. 7,741,416.

(30) Foreign Application Priority Data

Nov. 8, 2005 (KR) .................. 10-2005-0106485
Oct. 2, 2006 (KR) .................. 10-2006-0096866

(51) Int. Cl.
*C30B 29/54* (2006.01)

(52) U.S. Cl. ................. 117/68; 117/70; 117/72
(58) Field of Classification Search .......... 117/68, 117/70, 72
See application file for complete search history.

(56) References Cited

U.S. PATENT DOCUMENTS

| | | | |
|---|---|---|---|
| 5,206,922 A | 4/1993 | Westland et al. |
| 5,670,607 A | 9/1997 | Chen |
| 6,780,950 B2 | 8/2004 | Cho et al. |
| 6,797,057 B1 | 9/2004 | Amos et al. |
| 6,835,468 B2 | 12/2004 | Cho et al. |
| 6,875,819 B2 | 4/2005 | Sunaga et al. |
| 6,924,921 B2 | 8/2005 | Lewis, III et al. |
| 7,045,195 B2 | 5/2006 | Ozin et al. |
| 7,215,456 B2 | 5/2007 | Moon et al. |
| 7,298,544 B2 | 11/2007 | Moon et al. |
| 7,438,953 B2 | 10/2008 | Kotov et al. |
| 7,520,933 B2 | 4/2009 | Park et al. |
| 7,534,490 B1 | 5/2009 | Goh et al. |
| 7,538,159 B2 | 5/2009 | Wang et al. |
| 7,553,909 B2 | 6/2009 | Wang et al. |
| 7,560,510 B2 | 7/2009 | Wang et al. |
| 7,592,269 B2 | 9/2009 | Jacobs |

(Continued)

FOREIGN PATENT DOCUMENTS

| KR | 10-2002-0042665 A | 6/2002 |
|---|---|---|
| KR | 10-2003-0083913 | 11/2003 |

(Continued)

OTHER PUBLICATIONS

Subramania et al., "optical photonic crystals synthesized from colloidal systems of polystyrene spheres and nanocrystalline titania", Jornal of Lightwave Technology, vol. 17, No. 11, Nov. 1999, pp. 1970-1974, XP002583101.

(Continued)

*Primary Examiner* — Bob M Kunemund
(74) *Attorney, Agent, or Firm* — McKenna Long & Aldridge, LLP

(57) ABSTRACT

The present invention relates to colloidal photonic crystals using colloidal nanoparticles and a method for the preparation thereof, wherein by adding a viscoelastic material into a solution containing the colloidal nanoparticles when preparing the colloidal photonic crystals, a uniform volume contraction occurs due to the elasticity of the viscoelastic material even when a nonuniform volume contraction occurs while drying a dispersion medium in the colloidal solution. Thus, it is possible to prepare 2 or 3 dimensional colloidal photonic crystals of large scale with no defects in less time.

10 Claims, 4 Drawing Sheets

U.S. PATENT DOCUMENTS

| | | |
|---|---|---|
| 2002/0045030 A1 | 4/2002 | Ozin et al. |
| 2002/0143073 A1 | 10/2002 | Jiang et al. |
| 2003/0122112 A1 | 7/2003 | Foulger et al. |
| 2005/0127134 A1 | 6/2005 | Lu et al. |
| 2005/0185254 A1 | 8/2005 | Moon et al. |
| 2005/0203212 A1 | 9/2005 | Cusack et al. |
| 2005/0238561 A1 | 10/2005 | Beier et al. |
| 2005/0250158 A1 | 11/2005 | Parikh et al. |
| 2005/0270633 A1 | 12/2005 | Herman et al. |
| 2006/0033087 A1 | 2/2006 | Foulger et al. |
| 2006/0099414 A1 | 5/2006 | Koops et al. |
| 2006/0137601 A1 | 6/2006 | Miguez et al. |
| 2006/0171999 A1 | 8/2006 | Xin et al. |
| 2006/0175380 A1 | 8/2006 | Marshall |
| 2007/0163486 A1 | 7/2007 | Hong et al. |
| 2007/0182038 A1 | 8/2007 | Moon et al. |
| 2008/0081192 A1 | 4/2008 | Goh et al. |
| 2008/0130111 A1 | 6/2008 | Cheng et al. |
| 2009/0046350 A1 | 2/2009 | Herman et al. |
| 2009/0124726 A1 | 5/2009 | Goh et al. |
| 2009/0148703 A1 | 6/2009 | Goh et al. |

FOREIGN PATENT DOCUMENTS

| | | |
|---|---|---|
| KR | 10-2003-0083913 A | 11/2003 |
| KR | 10-2004-0005403 A | 1/2004 |

OTHER PUBLICATIONS

Weissman et al., "Thermally switchable predicities and diffraction from mesoscopically ordered materials", Science, vol. 274, Nov. 8, 1996, pp. 959-960, XP002583102.

Abu et al., "Self-standing polyaniline film of mono-particle layer", Electrochimica Acta, vol. 50, No. 18, Jun. 2005, pp. 3634-3639, XP0049412781SSN.

Meseguer, "colloidal crystals as photonic crystals" Colloids and Surfaces A: Physicochem. Eng. Aspects, vol. 270-271, 2005, pp. 1-7, XP002583103.

H. Miguez et al., "Control of the Photonic Crystal Properties of fcc-Packed Submicrometer $SiO_2$ Spheres by Sintering", Advanced Materials, vol. 10, No. 6, 1998, pp. 480-483.

P. Jiang et al., "Single-Crystal Colloidal Multilayers of Controlled Thickness", Chem. Mater. 11, 1999, pp. 2132-2140.

Y.A. Vlasov et al., "On-chip natural assembly of silicon photonic bandgap crystals", Nature, vol. 414, Nov. 2001, pp. 289-293.

J.D. Joannopoulos, "Self-assembly lights up", Nature, vol. 414, Nov. 2001, pp. 257-258.

A.L. Rogach et al., "Electrophoretic Deposition of Latex-Based 3D Colloidal Photonic Crystals: A Technique for Rapid Production of High-Quality Opals", Chem. Mater., vol. 12, 2000, pp. 2721-2726.

Z. Cheng et al., "Controlled growth of hard-sphere colloidal crystals", Nature, vol. 401, Oct. 1999, pp. 893-895.

B. Griesebock et al., "Large Photonic Films by Crystallization on Fluid Substrates", Chem. Mater., vol. 14, 2002, pp. 4023-4025.

Polyacrylates, Polymer Science Learning Center, Department of Polymer Science, The University of Southern Mississippi, 2005.

COLLOIDAL PHOTONIC CRYSTALS USING COLLOIDAL NANOPARTICLES AND METHOD FOR PREPARATION THEREOF

This application is a Divisional of prior application Ser. No. 11/593,052, filed Nov. 6, 2006, now U.S. Pat. No. 7,741,416 which claims the benefit of Korean Patent Application Nos. 10-2005-0106485 filed in Korea on Nov. 8, 2005, and 10-2006-0096866 filed in Korea on Oct. 2, 2006, which are hereby incorporated by reference in their entirety as if fully set forth herein.

TECHNICAL FIELD

The present invention relates to colloidal photonic crystals using colloidal nanoparticles and a method for the preparation thereof, and more particularly, to colloidal photonic crystals using colloidal nanoparticles and a method for the preparation thereof, wherein by adding a viscoelastic material, a uniform volume contraction occurs due to the elasticity of the viscoelastic material even when a nonuniform volume contraction occurs while drying a dispersion medium in the colloidal solution. Thus, it is possible to prepare 2 or 3 dimensional colloidal photonic crystals of large scale with no defects on a surface thereof in less time, and without a particle dimension limitation.

BACKGROUND ART

Photonic crystals are crystals having a regular structure of which the lattice distance is tens of nanometers to several micrometers, and are capable of regulating the optical properties in a range of ultraviolet rays, visible rays and infrared rays. Such photonic crystals exist in the natural world, for example opals, butterflies, and shells etc. each emitting beautiful light, and have been developed artificially by observing the structure of the natural crystals and then manufactured.

Typical methods of manufacturing such photonic crystals include the top-down method, such as photolithography and ion beam etching used in a conventional semiconductor process, and a bottom-up method used regularly to arrange nanoparticles with a uniform dimension.

The method of manufacturing photonic crystals through the conventional photolithography and ion beam etching has the advantage of making sophisticated regular structures, but has the disadvantages of very high incidental expenses and a long time being required to prepare large scale photonic crystals. On the other hand, the method of manufacturing photonic crystals through self-assembly of nanoparticles (Korean patent laid open 2003-0083913) has the advantages that no incidental equipment is required and it is possible to prepare large scale photonic crystals in less time, however it is also difficult to prepare large scale photonic crystals with no defects. Thus, in the field of preparing photonic crystals, a technology capable of building large scale photonic crystals with no defects in less time through the self-assembly of nanoparticles is an essential subject for commercial usage.

In particular, the preparation of photonic crystals using high molecular colloidal nanoparticles has been widely studied recently, and there are various methods such as a deposition method by gravity [H. Miguez et al., Adv. Mater. 10,480 (1998)], a vertical deposition method [P. Jiang et al., Chem. Mater. 11,2132 (1999)], a vertical deposition method through a temperature distribution [Y. A. Vlasov et al., Nature (London) 414,289(2001), J. D. Joannopoulos, Nature (London) 414,257(2001)], and an electrophoresis method [A. L. Rogach et al., Chem Mater. 12,2721 (2000)] etc.

The deposition method by gravity uses a phenomenon that, when motionlessly laying a solution in which a high molecular silica colloid is dispersed for a long time, particles are deposited onto the bottom by gravity and then are self-assembled. However, this method has the disadvantages that processing time is very long and the photonic crystals have defects. In addition, other methods are capable of preparing large scale photonic crystals in less time but also have a problem in that the photonic crystals have defects.

Further, in the case of preparing 2 or 3 dimensional photonic crystals using the polymer colloidal particles, spherical colloidal particles are generally self-assembled in the structure of a face centered cubic (FCC). In this case, the particles in a colloidal solution self-assemble onto a substrate as the solution is vaporized, the colloidal particles having liquidity in the case that the volume ratio thereof is up to 54%, but are crystalloid with no liquidity in the case that the ratio is more than that. Thereafter, the solution is vaporized until the volume ratio of the colloidal particles is 74%, the volume of the self-assembled colloidal particles in the crystalloid is thus contracted [Cheng et al., Nature (London) 410,893 (1999)]. In such a process of drying the solution, the colloidal particles are subjected to a nonuniform volume contraction thereby creating defects.

To solve the problem of defects resulting from such a volume contraction, a method using a liquid metal with liquidity as a substrate component may be used, but there is a problem in that it is difficult to apply commercially [Griesebock et al., Chem mater., 14,4023 (2002)].

DISCLOSURE OF THE INVENTION

It is an object of the present invention to provide colloidal photonic crystals using colloidal nanoparticles, a method for the preparation thereof and a method for preparing a colloidal photonic crystal base using the photonic crystals, whereby a uniform volume contraction occurs due to the elasticity of the viscoelastic material even though a nonuniform volume contraction occurs when drying a dispersion medium in a colloidal solution. Thus, it is possible to prepare 2 or 3 dimensional colloidal photonic crystals of large scale with no surface defects in less time and without a particle dimension limitation.

Another object of the present invention is to provide colloidal photonic crystals using colloidal nanoparticles, a method for the preparation thereof, and a method for preparing a colloidal photonic crystal base using the photonic crystals, which are suitable for use in lasers, sensors, piezo-electric sensors, actuators, chromatography separation membranes, catalyst carriers, optical integrated circuits, optical filters, liquid crystal alignment layers, super hydrophilic or super water-repellent membranes, photomasks, antireflection films, and display devices etc. which all require photonic crystals.

To achieve the above objects, the present invention provides a method for the preparation of colloidal photonic crystals using colloidal nanoparticles comprising a step of adding a viscoelastic material into a solution containing the colloidal nanoparticles.

The present invention also provides colloidal crystals which comprise self-assembled nanoparticles and a viscoelastic material settling the nanoparticles to have a predetermined elasticity.

Further, the present invention provides a method for the preparation of a colloidal photonic crystal base comprising a step of self-assembling another layer of colloidal particles, semiconductor particles, metal particles or metal-oxide particles into the gaps of the colloidal photonic crystal particles prepared by the above method.

Further, the present invention provides a method of preparing a colloidal photonic crystal base comprising the steps of producing a reverse cast using the colloidal photonic crystals prepared by the above method; and transcribing the structure and shape of the reverse cast into a base.

The present invention is described in detail hereinafter.

The present inventors confirmed that, as a result of drying after dissolving an added viscoelastic material into a dispersion medium of a solution containing colloidal nanoparticles, a uniform volume contraction occurs due to the elasticity of the viscoelastic material when drying, such that colloidal photonic crystals with no defects can be prepared therefrom, and thus accomplishing the object of the present invention.

The colloidal photonic crystals according to the present invention are characterized in that they are prepared by vaporizing a dispersion medium from a solution to self-assemble the colloidal nanoparticles onto a substrate after adding a viscoelastic material into the solution containing the colloidal nanoparticles.

The viscoelastic material used in the present invention makes a uniform volume contraction occur during the drying of the dispersion medium of the colloidal solution, thereby preventing the resulting colloidal photonic crystals from having defects.

There is no limitation on the viscoelastic material as long as it has normal viscoelasticity, however it is preferable to use a compound dissoluble in the dispersion medium of the solution containing the colloidal nanoparticles.

Specifically, in the case that the solution into which the viscoelastic material is added is a solution of water dispersed colloidal nanoparticles, every material capable of showing viscoelasticity when dissolved in an aqueous solution can be used, particularly polyvinyl pyrrolidone, polyvinyl alcohol, polyacrylic acid, poly(p-phenylene vinylene), polyethylene glycol, polyethyleneamine, or dextrine etc., and in the case that the solution into which the viscoelastic material is added is a solution of colloidal nanoparticles dispersed in an organic solvent, every material capable of showing viscoelasticity when dissolved in an organic solvent can be used, particularly polystyrene, polymethylmethacrylate, polyacrylate, or polyvinyl chloride etc.

The weight-average molecular weight (Mw) of the viscoelastic material is preferably 10 to 1,000,000.

The above viscoelastic material is preferably contained at 0.04 to 1 phr for 100 phr of nanoparticles in the colloidal nanoparticle solution. It is difficult to manufacture colloidal crystals with no defects when the viscoelastic material content is less than 0.04 phr, and the viscoelastic material prevents the colloidal particles from self-assembling, thereby inhibiting colloidal crystals from forming, when the amount of the viscoelastic material is more than 1 phr.

The above viscoelastic material is added to the solution containing the colloidal nanoparticles, which then self-assemble onto a substrate as the dispersion medium is vaporized from the solution, whereby colloidal photonic crystals can be obtained.

Specifically, the colloidal photonic crystals of the present invention can be prepared by the following steps of evenly dispersing nanoparticles into a dispersion medium; dissolving an added a viscoelastic material into the solution; vaporizing the dispersion medium from the solution to self-assemble the particles on an interface of a dispersion medium-air-substrate; and continuously transferring the self-assembled particles onto the interface.

There is no limitation on the nanoparticles, it can be selected from a group consisting of a polymer of polystyrene, polyalphamethylstyrene, polyacrylate, polymethylmetacrylates, polybenzylmetacrylate, polyphenylmetacrylate, poly-1-methylcyclohexylmetacrylate, polycyclohexylmetacrylate, polychlorobenzylmetacrylate, poly-1-phenylethylmetacrylate, poly-1,2-diphenylethylmetacrylate, polydiphenymethylmetacrylate, polyfurfurylmetacrylate, poly-1-phenylcyclohexylmetacrylate, polypentachlorophenylmetacrylate, polypentabromophenylmetacrylate, polydimethylsiloxane or poly-N-isopropylacrylamide etc., and copolymers thereof.

Particularly, the nanoparticles may be a metal oxide such as titanium oxide, zinc oxide, cerium oxide, tin oxide, thallium oxide, barium titanite, aluminum oxide, yttrium oxide, zirconium oxide, or copper oxide etc. Further, the nanoparticles may be a metal such as bismuth (Bi), lead (Pb), selenium (Se), or antimony (Sb) etc.

The nanoparticles are preferably 0.1 to 10 μM in diameter. It is difficult for the nanoparticles to self-assemble by vaporization of the dispersion medium if the diameter of the nanoparticles is less than 0.1 μm, and preparation of uniform photonic crystals is difficult if the diameter of the nanoparticles is more than 10 μm, as the particles sink easily or movement of the particles is not facilitated by vaporization of the dispersion medium.

It is desirable to select the dispersion medium from materials which do not dissolve the nanoparticles, Specifically, the dispersion medium may be selected from a group consisting of water, methanol, ethanol, propanol, butanol, ethylene glycol, glycerol, perfluorodecalin, perfluoromethyldecalin, perfluorononane, perfluoro iso acid, perfluorocyclohexane, perfluoro1,2-dimethylcyclohexane, perfluoro-2-methyl-2-pentene, perfluorokersene, hexane, cyclohexane, toluene, xylene, styrene, methylmethacrylate, and chloroform etc.

Vaporization of the dispersion medium is conventionally required to be carried out below the boiling point of the dispersion medium. The faster the vaporizing speed of the dispersion medium is, the less time that photonic crystals are self-assembled onto the interface of the dispersion medium-air-substrate. There is a problem that photonic crystals' defects may be induced if the vaporizing speed is too fast and regular photonic crystals cannot be obtained if the vaporizing speed is too slow. In the present invention, the optimum vaporizing condition for forming the crystals is varied in accordance with the kind of dispersion medium, and a person skilled in the art may easily select the condition from the disclosure of the present invention, therefore it is not necessary to specifically describe such a condition.

The photonic crystals formed on the interface of the dispersion medium-air-substrate through the above self-assembling process are continuously transferred onto the substrate, and the photonic crystals are moved by continuously moving the substrate or by continuously vaporizing the dispersion medium while the substrate is inserted in the dispersion medium perpendicularly or with an inclination of a predetermined angle.

FIG. 1 is a schematic diagram explaining the principal of preparing the colloidal photonic crystals with no defects according to the present invention compared to a conventional method of preparing colloidal photonic crystals.

Referring to (a) in FIG. 1, nanoparticles (10) are self-assembled on a base (12) as a crystalloid form by a dispersion medium (11) is vaporized in a colloidal solution. A defect (13) forms due to a nonuniform volume contraction in the process of drying the dispersion medium (11), thereby forming colloidal photonic crystals with defects.

On the contrary, referring to (b), in the case of using a dispersion medium 15 with a viscoelastic material dissolved in the colloidal solution, a uniform volume contraction occurs due to the elasticity of the viscoelastic material 15, even if a nonuniform volume contraction occurs in the process of drying the dispersion medium, thereby forming colloidal photonic crystals with no defects.

The colloidal photonic crystals self-assembled according to the present invention may be further subjected to a step of filling gaps in the photonic crystals with a semiconductor, metal, metal oxide, or organic matter etc.

The semiconductor can be selected from a group consisting of commonly used semiconductors such as Si, CdS, CdSe, and GaAs etc.; the metal can be selected from a group consisting of commonly used metals such as Ag, Au, Al, Pt, Pd etc., and alloys thereof; the metal oxide can be selected from a group consisting of common metal oxides such as $AlO_2$, $TiO_2$, $SiO_2$, $ZrO_2$, $Fe_2O_3$, and $ZnO$ etc.; and the organic matter can be selected from a group consisting of polydimethylsiloxane, polythiophene, polyquinoline, polypyrrole, polyacetylene, polyprolene, Poly(p-phenylene vinylene) etc., or derivatives thereof.

The present invention also provides colloidal photonic crystals comprising self-assembled nanoparticles and a viscoelastic material settling the nanoparticles with a predetermined elasticity.

Further, the present invention provides a colloidal photonic crystal base and a method for the preparation thereof, comprising a step of self-assembling another layer of colloidal photonic particles, semiconductor particles, metal particles or metal-oxide particles into gaps of the colloidal photonic particles prepared by the above method.

Further, the present invention provides a method of preparing a colloidal photonic crystal base comprising the steps of manufacturing a reverse cast using the colloidal photonic crystals prepared by the above method as a cast; and transcribing a structure and shape of the reverse cast into a base.

The colloidal photonic crystals and colloidal base of the present invention prepared as described above are adapted to be used in manufacturing lasers, sensors, piezo-electric sensors, actuators, chromatography separation membranes, catalyst carriers, optical integrated circuits, liquid crystal alignment layers, super hydrophilic or super water-repellent membranes, photomasks, antireflection films, and display devices etc. requiring the photonic crystals.

BRIEF DESCRIPTION OF THE DRAWINGS

The above aspects and features of the present invention will be more apparent by describing certain embodiments of the present invention with reference to the accompanying drawings, in which.

Figure 1:
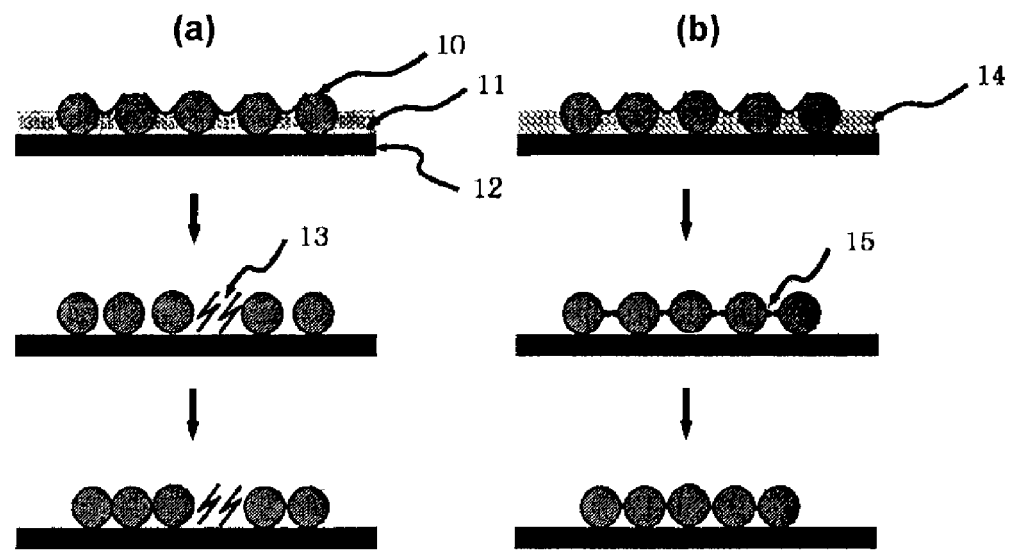
FIG. 1 is a schematic diagram explaining the principal of preparing colloidal photonic crystals with no defects according to the present invention compared to conventional preparation of colloidal photonic crystals.

10: nanoparticles
11: dispersion medium including viscoelastic material
12: base 13: defect
14: dispersion medium not including viscoelastic material
15: viscoelastic material

BEST MODES FOR CARRYING OUT THE INVENTION

Practical and presently preferred embodiments of the present invention are illustrated as shown in the following examples.

However, it will be appreciated that those skilled in the art, on consideration of this disclosure, may make modifications and improvements within the spirit and scope of the present invention.

EXAMPLE

Example 1

In a colloidal nanoparticle solution, water was used as a dispersion medium and 460 nm diameter polystyrene spherical particles were used as nanoparticles.

The 460 nm diameter polystyrene particles were dispersed in the water at 0.5 weight percent, and then 0.21 weight percent of polyvinyl pyrrolidone, as a viscoelastic material, was dissolved in the colloidal nanoparticle solution. After a substrate was deposited in the solution, the dispersion medium was vaporized in an oven at 60° C., whereby colloidal photonic crystals were prepared.

Figure 2:
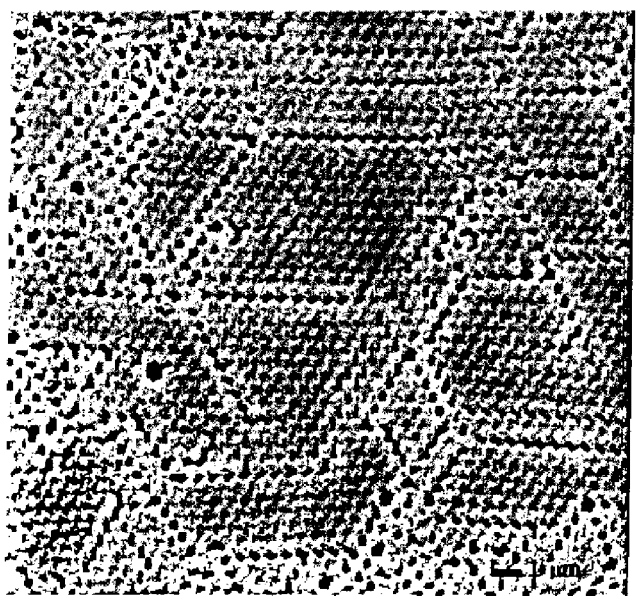
FIG. 2 and FIG. 3 are photographs by scanning electron microscope each showing colloidal photonic crystals prepared according to one embodiment of the present invention.

This was confirmed through observation with a scanning electron microscope as shown in FIG. 2.

Example 2

Figure 3:
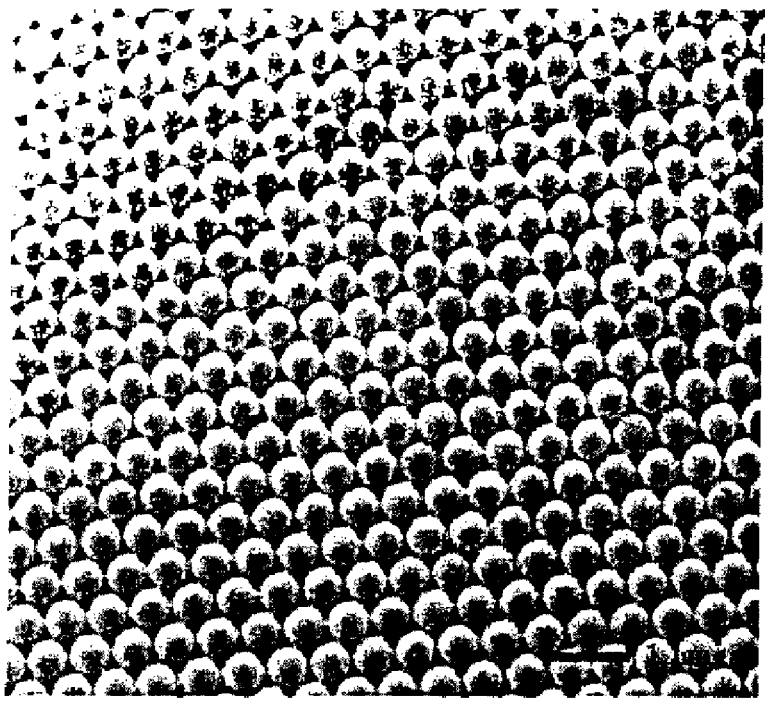

Photonic crystals were obtained by the same method as example 1 with the exception that 0.63 weight percent of polyvinyl pyrrolidone was used as the viscoelastic material. This was confirmed through observation with a scanning electron microscope as shown in FIG. 3.

Example 3

Photonic crystals were obtained by the same method as example 1 with the exception that 0.63 weight percent of polyacrylic acid was used as the viscoelastic material.

Example 4

Photonic crystals were obtained by the same method as example 1 with the exception that 0.63 weight percent of polyvinyl alcohol was used as the viscoelastic material.

Example 5

Photonic crystals were obtained by the same method as example 2 with the exception that 180 nm diameter polystyrene was used as the nanoparticle.

Example 6

Photonic crystals were obtained by the same method as example 2 with the exception that 240 nm diameter polystyrene was used as the nanoparticle.

Figure 4:
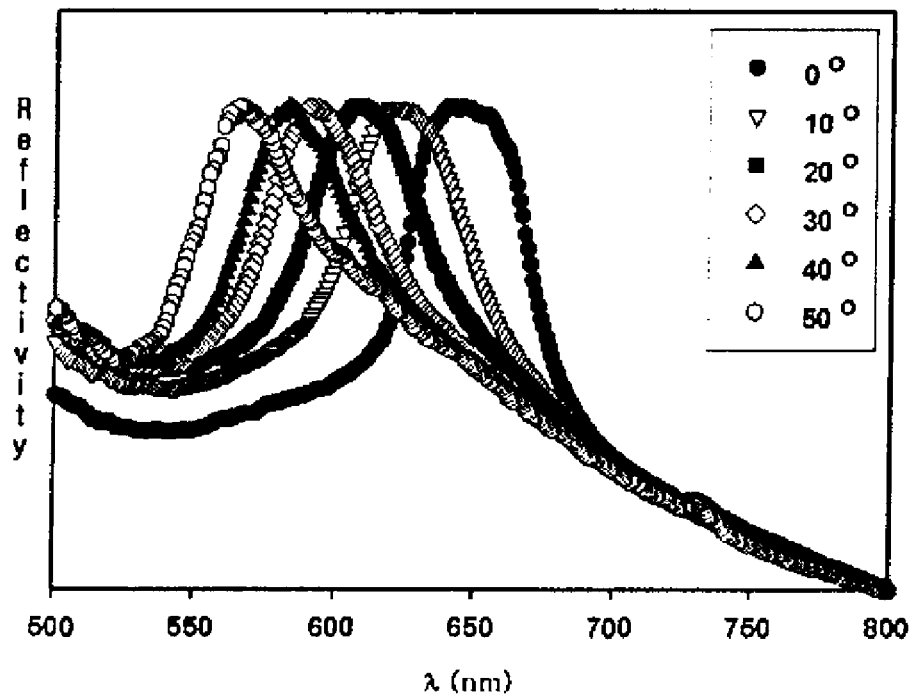
FIG. 4 is a graph showing the intensity along a wavelength of reflected light in accordance with the reflection angle of the colloidal photonic crystals prepared according to one embodiment of the present invention.

Using the photonic crystals prepared in example 6, the intensity of light radiated in the direction perpendicular to the photonic crystals and in accordance with the direction of reflected light was measured, and the results are shown in FIG. 4. As shown in FIG. 4, photonic crystals varying the wavelength of reflected light in accordance with direction are suitable for use as an optical filter.

Example 7

Photonic crystals were obtained by the same method as example 2 with the exception that 1 μm diameter polystyrene was used as the nanoparticle instead of 460 nm diameter polystyrene particles.

Example 8

Figure 5:
FIG. 5 and FIG. 6 are photographs by scanning electron microscope each each showing a reverse structure and a transcribed structure of colloidal photonic crystals prepared according to one embodiment of the present invention.

Polydimethylsiloxane rubber and a hardener were inserted into the colloidal photonic crystals prepared in example 2 at a weight ratio of 10:1, and then were hardened at 60° C. Thereafter, a cast with a reverse structure of the colloidal photonic crystals was prepared by detaching the polydimethylsiloxane rubber from the colloidal photonic crystals (FIG. 5).

Figure 6:
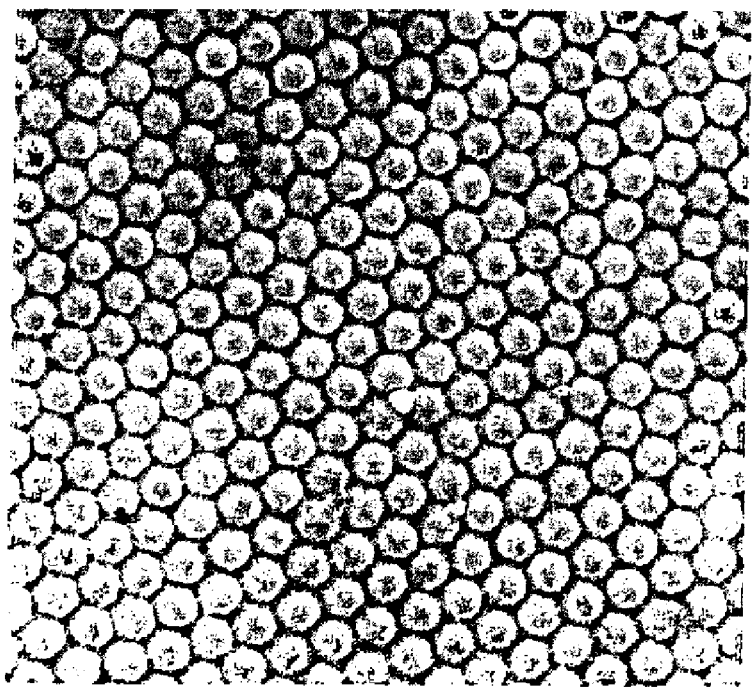

The cast of the polydimethylsiloxane rubber with the reverse structure of the colloidal photonic crystals was pressed onto a film coated with polystyrene, heat treated at 150° C. for 10 minutes, and then cooled at room temperature. Thereafter, the cast of the polydimethylsiloxane rubber was detached from the polystyrene film and the reverse structure of the rubber cast was transcribed into the film (FIG. 6).

Comparative Example 8

Photonic crystals were obtained by the same method as example 1 with the exception that the viscoelastic material was not used.

Figure 7:
FIG. 7 is a photograph by scanning electron microscope showing colloidal photonic crystals prepared according to a comparative example.

The result was observed with a scanning electron microscope as shown in FIG. 7.

INDUSTRIAL APPLICABILITY

According to the present invention, a uniform volume contraction occurs due to the elasticity of the viscoelastic material even when a nonuniform volume contraction occurs while drying the dispersion medium in the colloidal solution. Thus, it is possible to prepare 2 or 3 dimensional colloidal photonic crystals of large scale with no defects on a surface thereof in less time, and without a particle dimension limitation. they are suitable for use in lasers, sensors, piezo-electric sensors, actuators, chromatography separation membranes, catalyst carriers, optical integrated circuits, liquid crystal alignment layers, super hydrophilic or super water-repellent membranes, photomasks, antireflection films, and display devices etc. requiring the photonic crystals.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. Method of preparing colloidal photonic crystals, comprising the following steps of:
    a) dispersing nanoparticles evenly in a dispersion medium to form a solution;
    b) dissolving a viscoelastic material into the solution;
    c) vaporizing the dispersion medium from the solution to self-assemble the nanoparticles on an interface of a dispersion medium-air-substrate; and
    d) transferring the self-assembled particles onto the substrate,
    wherein the viscoelastic material is one or more selected from the group consisting of polyvinyl pyrrolidone, polyvinyl alcohol, poly(p-phenylene vinylene), polyethylene glycol, polyethyleneamine, dextrine, polymethylmethacrylate, polyacrylate and polyvinyl chloride.

2. The method of preparing colloidal photonic crystals as set forth in claim 1, wherein the weight-average molecular weight (Mw) of the viscoelastic material is 10 to 1,000,000.

3. The method of preparing colloidal photonic crystals as set forth in claim 1, wherein the viscoelastic material is contained by 0.04 to 1 phr for 100 phr of the nanoparticles in the colloidal nanoparticle solution.

4. The method of preparing colloidal photonic crystals as set forth in claim 1, wherein the nanoparticle is one or more selected from the group consisting of polystyrene, polyalphamethylstyrene, polyacrylate, polymethylmetacrylates, polybenzylmetacrylate, polyphenylmetacrylate, poly-1-methylcyclohexylmetacrylate, polycyclohexylmetacrylate, polychlorobenzylmetacrylate, poly-1-phenylethylmetacrylate, poly-1,2-diphenylethylmetacrylate, polydiphenymethylmetacrylate, polyfurfurylmetacrylate, poly-1-phenylcyclohexylmetacrylate, polypentachlorophenylmetacrylate, polypentabromophenylmetacrylate, polydimethylsiloxane and poly-N-isopropylacrylamide.

5. The method of preparing colloidal photonic crystals as set forth in claim 1, wherein the nanoparticle is one or more selected from the group consisting of titanium oxide, zinc oxide, cerium oxide, tin oxide, thallium oxide, barium titanite, aluminum oxide, yttrium oxide, zirconium oxide, and copper oxide.

6. The method of preparing colloidal photonic crystals as set forth in claim 1, wherein the nanoparticle is one or more selected from the group consisting of bismuth (Bi), lead (Pb), selenium (Se), and antimony (Sb).

7. The method of preparing colloidal photonic crystals as set forth in claim 1, wherein the diameter of the nanoparticle is 0.1 to 10 μm.

8. The method of preparing colloidal photonic crystals as set forth in claim 1, wherein the dispersion medium is one or more selected from the group consisting of water, methanol, ethanol, propanol, butanol, ethylene glycol, glycerol, perfluorodecalin, perfluoromethyldecalin, perfluorononane, perfluoro iso acid, perfluorocyclohexane, perfluoro-1,2-dimethylcyclohexane, perfluoro-2-methyl-2-pentene and perfluorokersene.

9. The method of preparing colloidal photonic crystals as set forth in claim 1, further comprising a step of filling gaps in the colloidal photonic crystals with a semiconductor, metal, metal oxide, or organic matter.

10. The method of preparing colloidal photonic crystals as set forth in claim 9, wherein the semiconductor is one or more selected from the group consisting of Si, CdS, CdSe and GaAs; the metal is one or more selected from the group consisting of Ag, Au, Al, Pt and Pd; the metal oxide is one or more selected from the group consisting of $AlO_2$, $TiO_2$, $SiO_2$, $ZrO_2$, $Fe_2O_3$, and ZnO; and the organic matter is one or more selected from the group consisting of polydimethylsiloxane, polythiophene, polyquinoline, polypyrrole, polyacetylene, polyprolene, Poly(p-phenylene vinylene) and derivatives thereof.

* * * * *